Feb. 27, 1951 R. W. SANDERS 2,543,067
OSCILLATOR CONVERTER
Filed March 18, 1944
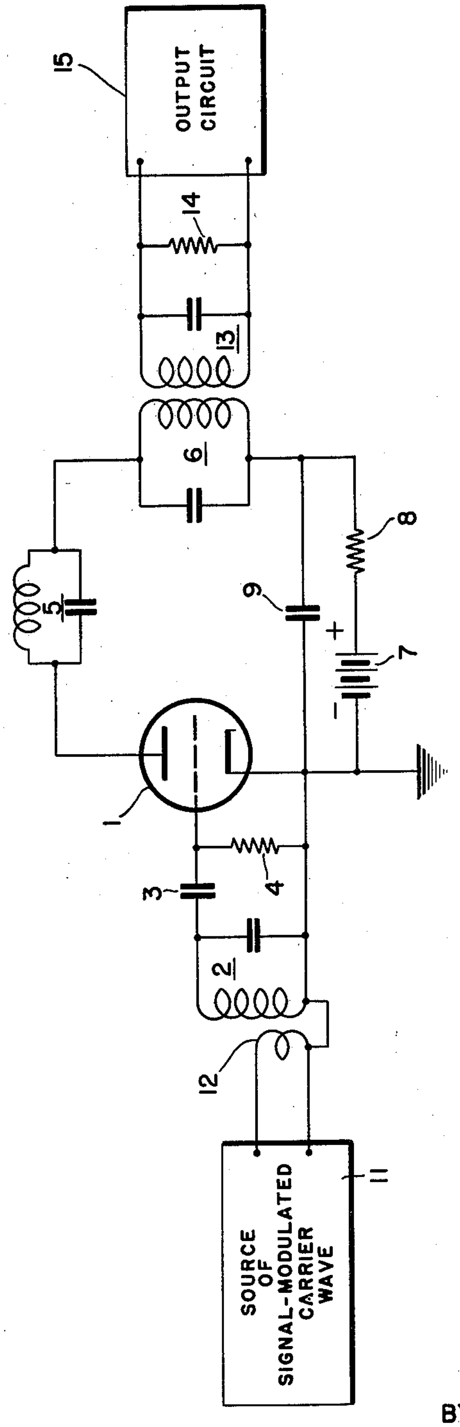
INVENTOR
ROBERT W. SANDERS
BY [signature]
ATTORNEY Patented Feb. 27, 1951 2,543,067

UNITED STATES PATENT OFFICE 2,543,067

OSCILLATOR CONVERTER

Robert W. Sanders, Fort Wayne, Ind., assignor, by mesne assignments, to Farnsworth Research Corporation, a corporation of Indiana Application March 18, 1944, Serial No. 527,070

2 Claims. (Cl. 250—20)

This invention relates to frequency converters and particularly to electronic apparatus functioning as a combined oscillator and modulator.

It is necessary frequently in radiant energy communication systems to translate or convert the frequency of a carrier wave, on which is modulated an intelligence signal, into a different frequency. One device suitable for this purpose which is widely used as a so-called oscillator-modulator or oscillator-converter. Conventional apparatus of this type ordinarily employs a multielectrode vacuum tube. Some of the electrodes are interconnected for the development and interchange of energy in a manner to generate sustained oscillations of a predetermined frequency. This frequency differs from the frequency of the signal-modulated carrier wave by an amount equal to the intermediate frequency to which it is desired to convert the intelligence signals. The signal-modulated carrier wave is coupled to others of the tube electrodes. Thus, by means of electron coupling within the tube there is produced the desired intermediate frequency which is modulated by the intelligence signals. In this manner a frequency conversion of the carrier wave for the intelligence signals is effected.

As is well known in the art, however, the number of circuit components required for use with a multielectrode tube of this character is appreciable. Furthermore, the interconnections of these components with the various tube electrodes is relatively complicated. In most cases the conversion gain of which such a device is capable is not particularly high, especially when carrier waves of relatively high frequencies are involved.

It, therefore, is an object of the present invention to provide a novel oscillator-converter which is capable of producing relatively great conversion gains at high frequencies and which is simpler in construction than devices of this character used heretofore.

In accordance with the invention, there is provided an electron discharge device having a control circuit and a controlled circuit. These circuits are tuned to an oscillator frequency. There is coupled to the control circuit a signal-modulated carrier wave having a frequency differing from the oscillator frequency. The controlled circuit of the device includes means for developing signal-modulated energy at an intermediate frequency corresponding to the difference between the oscillator frequency and the signal-modulated carrier wave frequency. A coupling is provided between the control and controlled circuits for the feedback of sufficient energy to the control circuit to develop sustained oscillations in the electronic device at the oscillator frequency. A utilization or output circuit is coupled to the means in the controlled circuit in which the intermediate frequency carrier wave energy is developed.

For a better understanding of the invention, together with other and further objects thereof, reference is had to the following description, taken in connection with the accompanying drawing, and its scope will be pointed out in the appended claims.

The single figure of the accompanying drawing is a schematic circuit diagram of apparatus embodying the instant invention in a preferred form.

Having reference to the drawing, there is shown a vacuum tube 1 which may be a triode of the 9002 type or its equivalent. For the control or grid circuit of the tube 1 there is provided a parallel resonant circuit 2 which is tuned to a relatively high oscillator frequency. This tuned circuit is coupled to the tube grid by a condenser 3 for which there is provided a leak to ground by a resistor 4. The controlled or anode circuit of the tube includes a series connection of two parallel resonant circuits 5 and 6. The circuit 5 is tuned for resonance at the oscillator frequency and the circuit 6 to an intermediate frequency. Space current for the tube 1 is supplied from a source of energy, such as a battery 7, the negative terminal of which is grounded and the positive terminal of which is connected by a resistor 8 to one terminal of the tuned circuit 6. The battery 7 and the resistor 8 are by-passed for alternating current by a condenser 9.

A source of signal-modulated carrier wave 11 is connected to a coil 12. The frequency of this carrier wave is relatively high and is somewhat closely related to the oscillator frequency. In the arrangement disclosed in the illustrative embodiment of the invention the carrier wave frequency differs from the oscillator frequency by not more than 5%. The coil 12 is inductively related to the tuned circuit 2.

There also is provided a parallel resonant circuit 13 which is inductively coupled to the tuned circuit 6 and is adjusted for resonance at the intermediate frequency. The tuned circuit 13 is shunted by a resistor 14 to the terminals of which is connected a suitable output or utilization circuit 15.

Having reference now to the operation of the described apparatus embodying the invention, it is apparent that there is provided a tuned-plate tuned-grid oscillator, including the tube 1 and the tuned circuits 2 and 5. In this case the coupling between the controlled anode circuit and the control grid circuit of the tube is effected by the capacity between the anode and grid electrodes of the tube. Such a device functions in a well known manner to generate sustained oscillations at the frequency for which the circuits 2 and 5 are tuned.

Inasmuch as the frequency of the carrier wave derived from the source 11 does not differ appreciably from the oscillator frequency by more than the specified 5%, there is developed in the tuned circuit 2 signal-modulated energy at the frequency of the carrier wave. The modulated carrier wave energy and the energy at the oscillator frequency thus are combined in the tube 1. In this manner there is developed in the anode circuit of this tube energy both at the oscillator frequency and at an intermediate frequency which corresponds to the difference between the oscillator frequency and the frequency of the carrier wave derived from the source 11. The oscillator frequency energy is developed in the tuned circuit 5 and the intermediate frequency energy is developed in the tuned circuit 6. It is obvious, of course, that the intermediate frequency energy developed in the manner described is modulated by the intelligence signals with which the carrier wave was modulated. By means of the coupling between the circuits 6 and 13 and the described connections of the latter to a suitable output circuit 15, energy at the intermediate frequency and modulated by the intelligence signal is developed in the circuit 13 by induction and impressed upon the output 15 for subsequent utilization, as desired.

Apparatus in accordance with the foregoing description operating in the 200 to 300 megacycle region of the frequency spectrum has been found to give very good results. It has been found to give considerably higher conversion gains than those obtainable by frequency converter circuits known to the prior art. Such apparatus not only produces these improved results but also utilizes fewer circuit components connected in a simpler manner than that required by conventional devices.

While there has been described what, at present, is considered the preferred embodiment of the invention, it will be obvious to those skilled in the art that various changes and modifications may be made therein without departing from the invention, and therefore, it is aimed in the appended claims to cover all such changes and modifications as fall within the true spirit and scope of the invention.

What is claimed is:

1. An oscillator-converter comprising, a vacuum tube having an anode, a cathode and a control grid as its only electrodes, a first parallel resonant circuit coupled between said control grid and said cathode and tuned to an oscillator frequency, a source of signal-modulated carrier wave coupled in circuit with said control grid and having a frequency differing from said oscillator frequency, a second parallel resonant circuit connected in circuit with said anode and said cathode and tuned to said oscillator frequency, means including the interelectrode capacity between said anode and said grid for coupling said first and second resonant circuits in a manner to effect the generation of a wave having said oscillator frequency, a third parallel resonant circuit connected in circuit with said anode and said cathode and tuned to an intermediate frequency corresponding to the difference between said oscillator frequency and said carrier wave frequency, and an output circuit coupled to said third resonant circuit.

2. An oscillator-converter comprising, a vacuum tube having an anode, a cathode and a control grid as its only electrodes, a first parallel resonant circuit coupled between said control grid and said cathode and tuned to an oscillator frequency, a source of signal-modulated carrier wave coupled to said first resonant circuit and having a frequency differing by a relatively small amount from said oscillator frequency, a second parallel resonant circuit connected between said anode and said cathode and tuned to said oscillator frequency, means including the interelectrode capacity between said anode and said grid for regeneratively coupling said first and second resonant circuits, a third parallel resonant circuit connected in series with said second circuit and tuned to an intermediate frequency corresponding to the difference between said oscillator frequency and said carrier wave frequency, and an intermediate frequency output circuit inductively coupled to said third resonant circuit.

ROBERT W. SANDERS.

REFERENCES CITED

The following references are of record in the file of this patent:

UNITED STATES PATENTS

| Number | Name | Date |
|---|---|---|
| 1,113,149 | Armstrong | Oct. 6, 1914 |
| 1,313,093 | Langmuir | Aug. 12, 1919 |
| 1,469,889 | Chaffee | Oct. 9, 1923 |
| 1,518,633 | Carpenter | Dec. 9, 1924 |
| 1,940,519 | Wyckoff | Dec. 19, 1933 |
| 2,053,414 | Barden | Sept. 8, 1936 |